US012666210B2

(12) United States Patent
Ng et al.

(10) Patent No.: US 12,666,210 B2
(45) Date of Patent: Jun. 23, 2026

(54) PORTABLE COMMUNICATIONS DEVICE AND METHOD FOR ENHANCING PERFORMANCE OF PORTABLE COMMUNICATIONS DEVICE

(71) Applicant: MOTOROLA SOLUTIONS, INC., Chicago, IL (US)

(72) Inventors: Lian Kooi Ng, Taiping (MY); Boon Kheng Hooi, Gelugor (MY); Kah Khoon Khoo, Butterworth (MY); Wai Mun Lee, Ipoh (MY); Yu Sheng Lim, Bayan Lepas (MY); Teik Seng Saw, Sungai Petani (MY); Chen Kok Yeoh, Bukit Mertajam (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 161 days.

(21) Appl. No.: 18/620,024

(22) Filed: Mar. 28, 2024

(65) Prior Publication Data

US 2025/0310710 A1     Oct. 2, 2025

(51) Int. Cl.
H04R 29/00 (2006.01)
H03F 3/24 (2006.01)

(52) U.S. Cl.
CPC ........... H04R 29/001 (2013.01); H03F 3/245 (2013.01); H03F 2200/03 (2013.01)

(58) Field of Classification Search
None
See application file for complete search history.

(56) References Cited

U.S. PATENT DOCUMENTS

| | | | |
|---|---|---|---|
| 7,643,263 B2 | 1/2010 | Abudul Muthalib et al. | |
| 10,368,167 B2 | 7/2019 | Yeoh et al. | |
| 11,088,531 B2 | 8/2021 | Azizan et al. | |
| 11,387,645 B2 | 7/2022 | Azizan et al. | |
| 11,720,318 B2 * | 8/2023 | See | H03F 3/187 |
| | | | 381/77 |
| 2021/0351586 A1 | 11/2021 | Azizan et al. | |
| 2021/0409865 A1 | 12/2021 | Dayan et al. | |

FOREIGN PATENT DOCUMENTS

| | | |
|---|---|---|
| CN | 109144457 B | 6/2022 |
| CN | 115695640 A | 2/2023 |

* cited by examiner

*Primary Examiner* — K. Wong
(74) *Attorney, Agent, or Firm* — Michael Best & Friedrich LLP

(57) ABSTRACT

One example provides a portable communications device including a speaker, a power amplifier configured to provide audio signals to the speaker, a sensing circuit configured to sense a variable parameter of the speaker, and a control circuit coupled to the sensing circuit. The control circuit is configured to selectively connect a resistive load between the power amplifier and the speaker based on the variable parameter.

20 Claims, 5 Drawing Sheets

PORTABLE COMMUNICATIONS DEVICE AND METHOD FOR ENHANCING PERFORMANCE OF PORTABLE COMMUNICATIONS DEVICE

BACKGROUND

Hazardous location (HAZLOC) environments such as chemical plants, mines, mills, and the like may produce gases, dust, fibers or other substances that may be explosive when exposed to high temperatures. Electronic devices used in these environments may generate heat during operation that may provide an ignition source.

BRIEF DESCRIPTION OF THE SEVERAL VIEWS OF THE DRAWINGS

In the accompanying figures similar or the same reference numerals may be repeated to indicate corresponding or analogous elements. These figures, together with the detailed description, below are incorporated in and form part of the specification and serve to further illustrate various embodiments, examples, aspects, and features of concepts that include the claimed subject matter, and to explain various principles and advantages of those embodiments, examples, aspects, and features.

Figure 1:
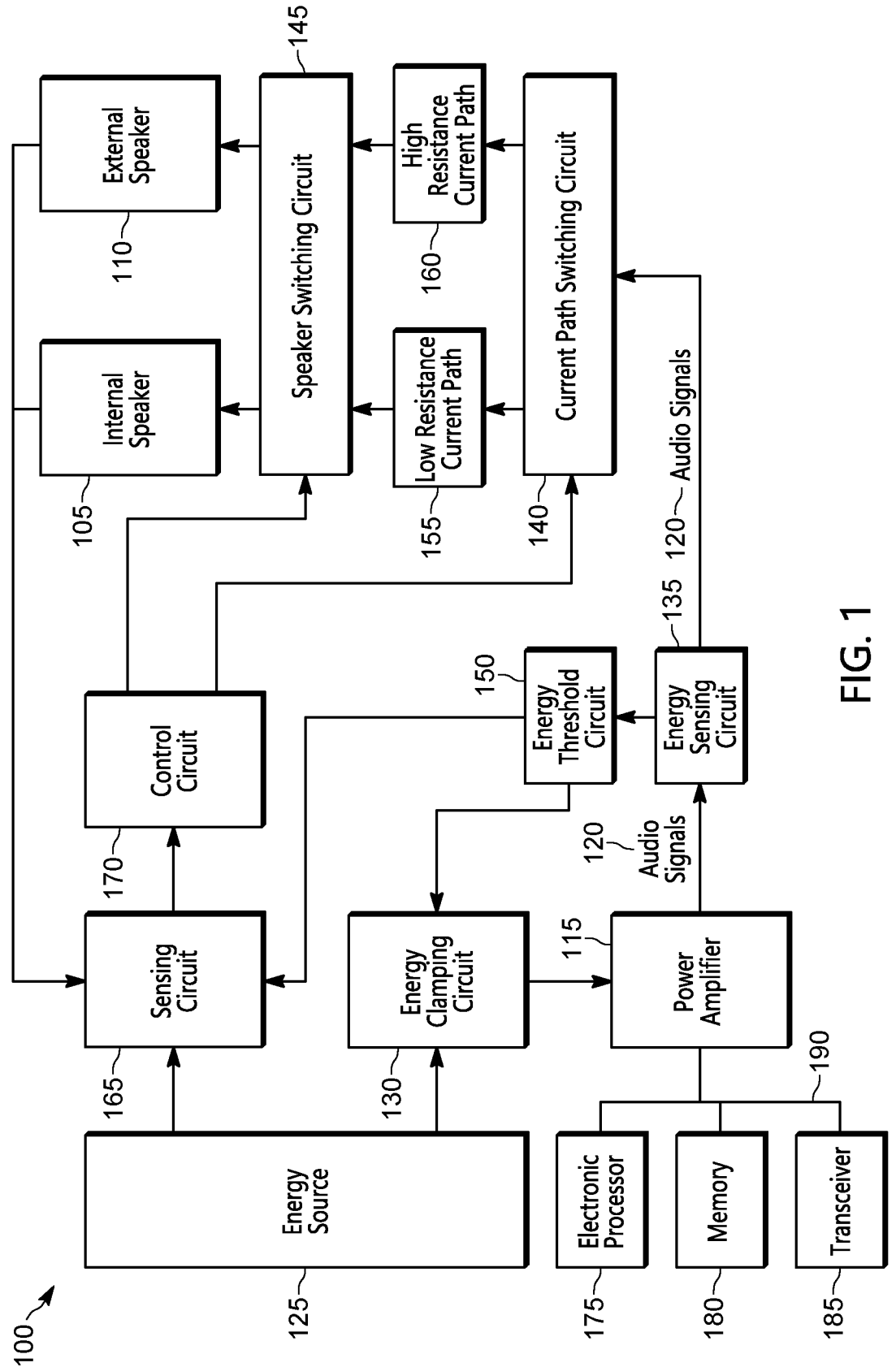
FIG. 1 is a block diagram of a portable communications device in accordance with some examples.

Skilled artisans will appreciate that elements in the figures are illustrated for simplicity and clarity and have not necessarily been drawn to scale. For example, the dimensions of some of the elements in the figures may be exaggerated relative to other elements to help improve understanding of the examples, aspects, and features presented in this disclosure.

The system, apparatus, and method components have been represented where appropriate by conventional symbols in the drawings, showing only those specific details that are pertinent to understanding of the various embodiments, examples, aspects, and features of the present disclosure so as not to obscure the disclosure with details that will be readily apparent to those of ordinary skill in the art having the benefit of the description herein.

DETAILED DESCRIPTION OF THE INVENTION

Electronic devices that are rated for operation in HAZLOC environments are designed to be intrinsically safe by limiting the energy, both electrical and thermal, that can result in an ignition. Specifically, intrinsically safe electronic devices include protection circuit that shut off power to the components of the electronic devices when high energy or temperature are detected. For example, intrinsically safe electronic devices are designed to operate to have an energy exposure no more than 20 micro Joules ($\mu$J) within each 20 micro seconds ($\mu$s) window.

Portable communications devices, for example portable two-way radios, mobile two-way radios, smart telephones, smart wearable electronic devices, and the like are used in HAZLOC environments as a main form of communication. Peripheral components that may be exposed to outside of the portable communications device, for example, speakers may present an ignition source when carrying high energy. Energy limiting circuits may be effective at reducing the ignition risk from the speakers. However, this energy limiting may result in reduced loudness and clarity of the audio when conventional energy limiting techniques are used.

One example method for energy limiting may include sensing the speaker load. However, the speaker impedance may change significantly across environmental temperature ranges. As much as a 30% reduction in impedance may be observed in across operating temperature limits of HAZLOC environments. Impedance variance across temperatures results in difficulty in optimizing the sensing range while not sacrificing the maximum audio performance. Accordingly, there is a need for a portable communications device and method for enhancing performance of the portable communications device for operation in HAZLOC environments.

One example provides a portable communications device including a peripheral component, a signal source configured to provide operating signals to the peripheral component, a sensing circuit configured to sense a variable parameter of the peripheral component, and a control circuit coupled to an output of the sensing circuit. The control circuit is configured to selectively connect a resistive load between the signal source and the peripheral component based on an indication of the variable parameter received from the output.

Another example provides a method for enhancing performance of a portable communications device. The method includes operating a peripheral component using operating signals from a signal source and determining, using a sensing circuit, a variable parameter of the peripheral component. The method also includes selectively connecting, using a control circuit coupled to the sensing circuit, a resistive load between the signal source and the peripheral component based on the variable parameter.

Another example provides a portable communications device including a speaker, a power amplifier configured to provide audio signals to the speaker, a sensing circuit configured to sense a variable parameter of the speaker, and a control circuit coupled to an output of the sensing circuit. The control circuit is configured to selectively connect a resistive load between the power amplifier and the speaker based on an indication of the variable parameter received from the output.

Each of the above-mentioned examples will be discussed in more detail below, starting with example system and device architectures of the system in which the examples may be practiced, followed by an illustration of processing blocks for achieving an improved technical method, device, and system for disaster prediction and response.

Further advantages and features consistent with this disclosure will be set forth in the following detailed description, with reference to the figures.

FIG. 1 is a block diagram of one example embodiment of a portable communications device 100. The portable communications device 100 is, for example, a two-way radio, a mobile device, a tablet computer, a personal computer, a wearable device, or the like. In the example illustrated, the portable communications device 100 is a portable two-way radio including an internal speaker 105 (for example, a first peripheral component) and an external speaker 110 (for example, a second peripheral component). The internal speaker 105 is provided in or on the housing of the portable communications device 100 and represents the built-in speaker of the portable communications device 100. The external speaker 110 may be attached to the portable communications device 100 using an audio cord and represents an auxiliary attachable speaker of the portable communications device 100.

The portable communications device 100 includes an audio power amplifier 115 (for example, a signal source) that provides audio signals 120 to the internal speaker 105 and the external speaker 110. The audio power amplifier 115 amplifies the audio signals received from, for example, another portable communications device 100 via a transceiver of the portable communications device 100. The examples provided herein are described with respect to the speakers 105, 110 as the peripheral components and the audio power amplifier 115 as the signal source. However, the techniques described herein are equally applicable to a camera, sensor, vibrator interface as the peripheral component and their corresponding signal sources that provide operating signals.

The portable communications device 100 includes an energy source 125, for example, a battery, a battery pack, an AC input source, or the like. The energy source 125 provides operating electrical power to the audio power amplifier 115 and other components of the portable communications device 100. An energy clamping circuit 130 (e.g., an energy limiting circuit) is electrically coupled between the energy source 125 and the audio power amplifier 115. The energy clamping circuit 130 is controllable to clamp the electrical energy (that is, limit current flow) provided from the energy source 125 to the audio power amplifier 115.

The portable communications device 100 includes an energy sensing circuit 135, a current path switching circuit 140, and a speaker switching circuit 145 (collectively referred to as a transient energy module) electrically connected between the audio power amplifier 115 and the speakers 105, 110. The energy sensing circuit 135 is configured to receive the audio signals 120 from the audio power amplifier 115 and provide the audio signals 120 to the current path switching circuit 140. The energy sensing circuit 135 is also configured to detect an energy of the audio signals 120 and provide an indication of the detected energy to an energy threshold circuit 150. The energy threshold circuit 150 compares the detected energy against a predetermined threshold and outputs a clamping signal to the energy clamping circuit 130. For example, the energy threshold circuit 150 may output a first signal when the detected energy does not exceed the predetermined threshold and a second signal when the detected energy exceeds the threshold. The threshold may be 20 µJ for 20 µs. When the energy clamping circuit 130 receives the first signal, the energy clamping circuit 130 does not restrict the power flow between the energy source 125 and the audio power amplifier 115. When the energy clamping circuit 130 receives the second signal, the energy clamping circuit 130 clamps or terminates the power flow between the energy source 125 and the audio power amplifier 115.

A low resistance current path 155 (for example, a first current path) and a high resistance current path 160 (for example, a second current path) are electrically provided between the current path switching circuit 140 and the speaker switching circuit 145. The low resistance current path 155 and the high resistance current path 160 therefore connect the signal source (for example, the audio power amplifier 115) to the peripheral component (for example, the speakers 105, 110). The high resistance current path 160 offers higher resistance (or higher impedance) to electrical signals (for example, the audio signals 120) than the low resistance current path 155. In one example, the low resistance current path 155 has a zero or negligible resistance. That is, no additional resistance is coupled in the low resistance current path 155. A resistive load may be connected in the high resistance current path 160. In this example, a 1-ohm resistance may be coupled in the high resistance current path 160. That is, the high resistance current path 160 has a resistance 1-ohm greater than the resistance of the low resistance current path 155. In other examples, different resistance values may be used in the low resistance current path 155 and the high resistance current path 160.

The current path switching circuit 140 selectively provides the audio signals 120 on either the low resistance current path 155 or the high resistance current path 160 to the speakers 105, 110 via the speaker switching circuit 145. Specifically, the current path switching circuit 140 may selectively enable the low resistance current path 155 or the high resistance current path 160. The speaker switching circuit 145 selectively provides the audio signals 120 to the internal speaker 105 or the external speaker 110. In one example, the portable communications device 100 includes only a single speaker (for example, the internal speaker 105). In this example, the speaker switching circuit 145 may not be required or may be modified accordingly.

The portable communications device 100 includes a sensing circuit 165 that is configured to measure or detect a variable parameter. The variable parameter is, for example, a voltage of the energy source, a temperature of the internal speaker 105, a resistance of the internal speaker 105, a temperature of the external speaker 110, a resistance of the external speaker 110, a current flow to the power amplifier 115, or the like. The sensing circuit 165 may also receive an indication of a current flow between the audio power amplifier 115 and the speakers 105, 110 from the energy sensing circuit 135 or the energy threshold circuit 150. The portable communications device 100 also includes a control circuit 170 configured to receive an indication of the variable parameter from the sensing circuit 165. The control circuit 170 provides control signals for controlling the current path switching circuit 140 and the speaker switching circuit 145.

The portable communications device 100 also includes an electronic processor 175, a memory 180, and a transceiver 185. The electronic processor 175, the memory 180, and the transceiver 185 communicate over one or more control and/or data buses (for example, a communication bus 190). In some examples, the electronic processor 175 is implemented as a microprocessor with separate memory, such as the memory 180. In other examples, the electronic processor 175 may be implemented as a microcontroller (with memory 180 on the same chip). In other examples, the electronic processor 175 may be implemented using multiple processors. In addition, the electronic processor 175 may be implemented partially or entirely as, for example, a field-programmable gate array (FPGA), an applications specific integrated circuit (ASIC), an ×86 processor, and the like and the memory 180 may not be needed or be modified accordingly. In the example illustrated, the memory 180 includes non-transitory, computer-readable memory that stores instructions that are received and executed by the electronic processor 175 to carry out the functionality of the portable communications device 100 described herein. The memory 180 may include, for example, a program storage area and a data storage area. The program storage area and the data storage area may include combinations of different types of memory, such as read-only memory and random-access memory. In some embodiments, the portable communications device 100 may include one electronic processor 175, and/or a plurality of electronic processors 175 in a cloud computer cluster arrangement, one or more of which may be executing none, all, or a portion of the applications or instructions of the portable communications device 100, sequentially or in parallel across the one or more electronic processors 175. One or more proxy servers or load balancing servers may control which one or more electronic processors 175 perform any part or all of the applications provided below.

The transceiver 185 enables wired and/or wireless communication between the portable communications device 100 and other portable communications devices 100 or other electronic devices. In some examples, the transceiver 185 may comprise separate transmitting and receiving components. FIG. 1 illustrates only one example of the portable communications devices 100. The portable communications devices 100 may include more or fewer components and may perform functions other than those explicitly described herein.

Figure 2:
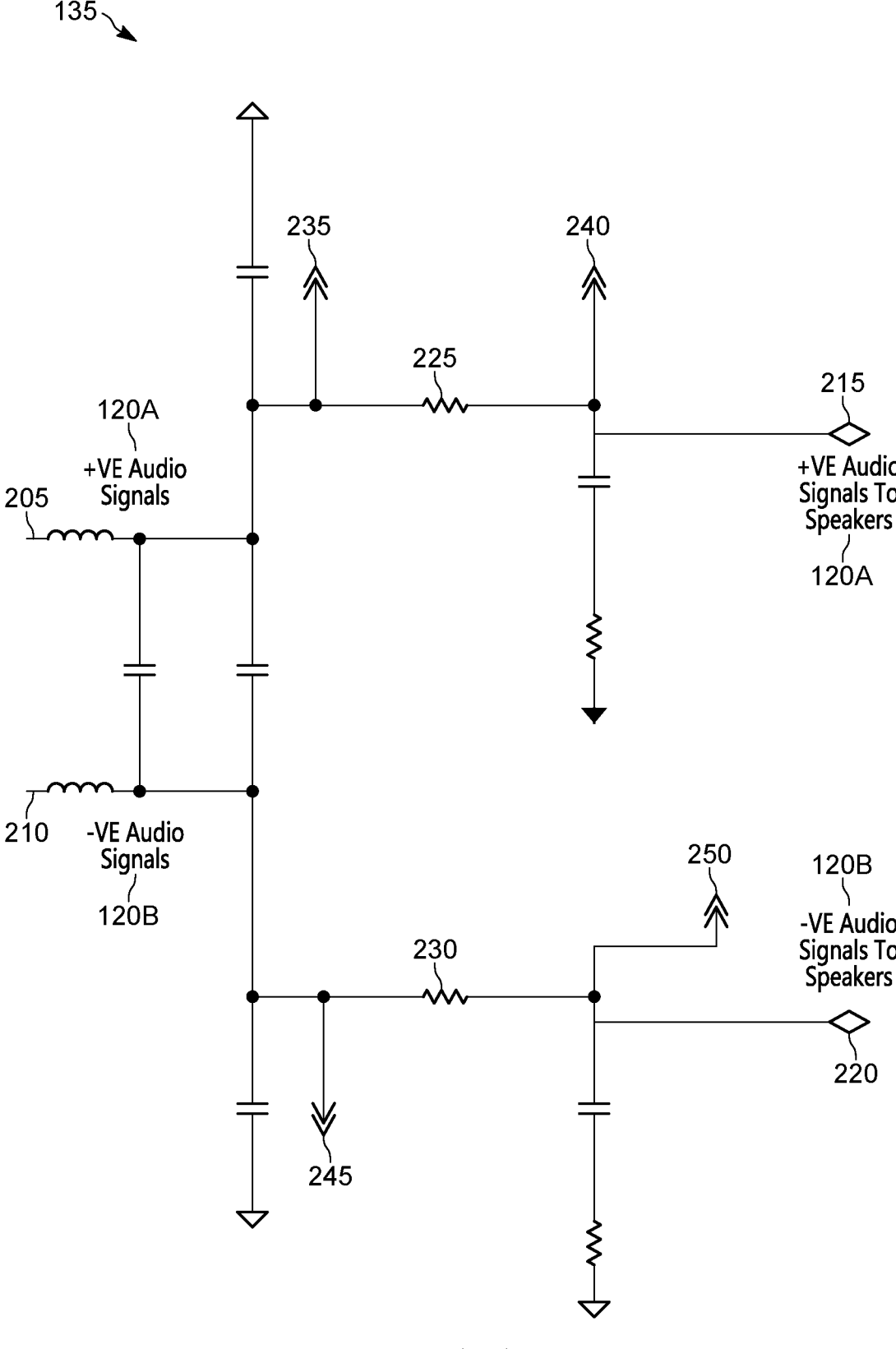
FIG. 2 is a schematic of an energy sensing circuit of the portable communications device of FIG. 1 in accordance with some examples.

FIG. 2 illustrates a schematic of an example implementation of the energy sensing circuit 135 connected between the audio power amplifier 115 and the speakers 105, 110. The energy sensing circuit 135 receives audio signals 120 from the audio power amplifier 115 as positive audio signals 120A and negative audio signals 120B at a positive audio input terminal 205 and a negative audio input terminal 210 respectively. The energy sensing circuit includes a positive audio output terminal 215 and a negative audio output terminal 220 that provide the positive audio signals 120A and the negative audio signals 120B to the speaker 105, 110 via the current path switching circuit 140. A first resistor 225 is electrically coupled between the positive audio input terminal 205 and the positive audio output terminal 215. A second resistor 230 is electrically coupled between the negative audio input terminal 210 and the negative audio output terminal 220. The first resistor 225 and the second resistor 230 my act as shunt resistors to detect the current flow to the speakers 105, 110.

The energy sensing circuit 135 includes a first positive pin 235 and a second positive pin 240 connected across the first resistor 225. The first positive pin 235 and the second positive pin 240 are connected to the energy threshold circuit 150. The energy sensing circuit 135 includes a first negative pin 245 and a second negative pin 250 connected across the second resistor 230. The first negative pin 245 and the second negative pin 250 are connected to the energy threshold circuit 150.

Figure 3:
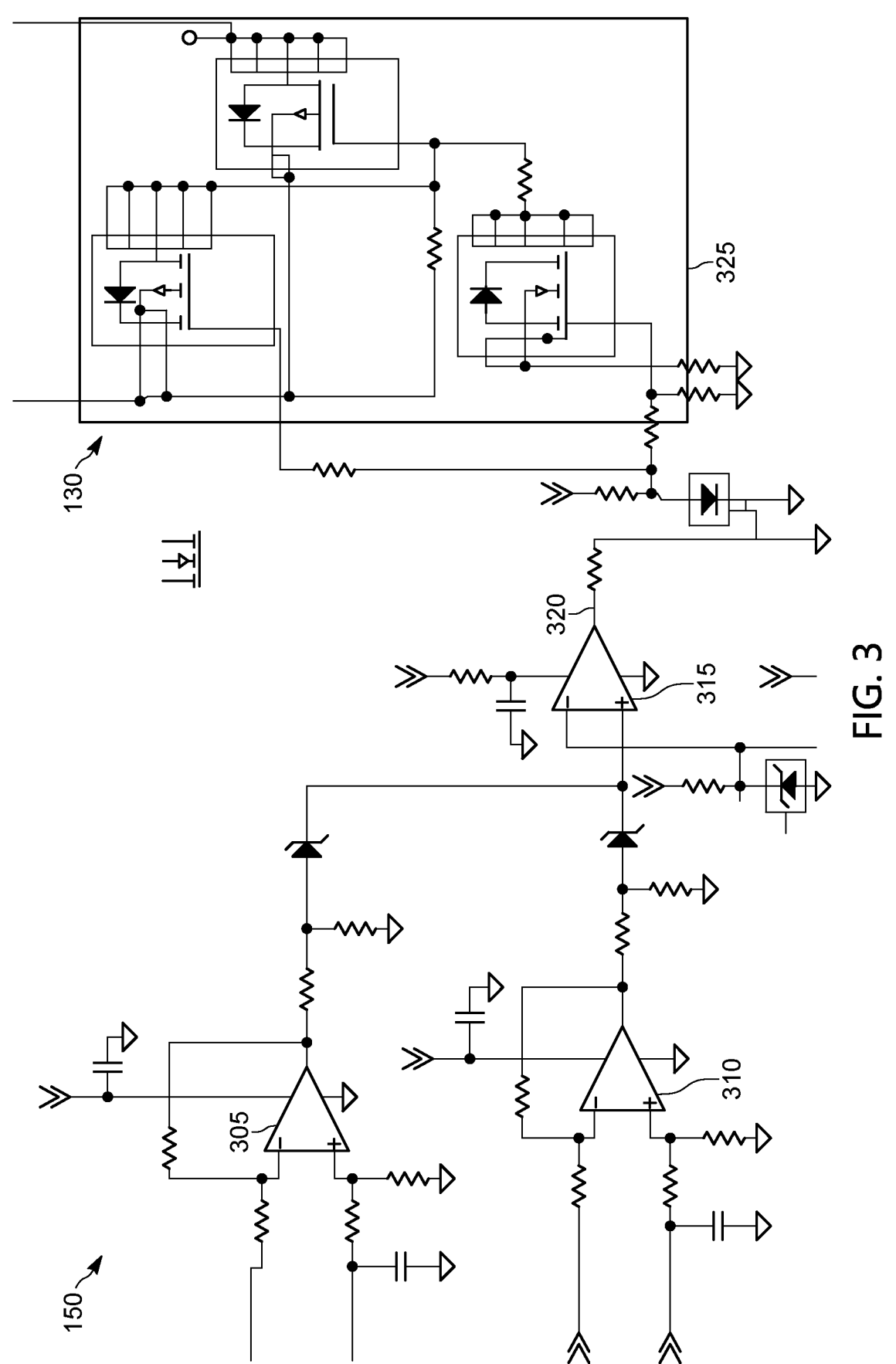
FIG. 3 is a schematic of an energy threshold circuit and an energy clamping circuit of the portable communications device of FIG. 1 in accordance with some examples.

FIG. 3 illustrates a schematic of an example implementation of the energy threshold circuit 150 and the energy clamping circuit 130 of FIG. 1. The energy threshold circuit 150 includes a positive energy comparator 305, a negative energy comparator 310, and a threshold comparator 315. The positive energy comparator 305 receives an indication of the positive audio signals 120A from the first positive pin 235 and the second positive pin 240 of FIG. 2 at the inverting input and the non-inverting input. The negative energy comparator 310 receives an indication of the negative audio signals 120B from the first negative pin 245 and the second negative pin 250 of FIG. 2 at the inverting input and the non-inverting input. The output of the positive energy comparator 305 and the negative energy comparator 310 are combined and provided as an input to the threshold comparator 315. The input to the threshold comparator 315 is compared to a threshold value (for example, a threshold voltage or threshold current) at the other input of the threshold comparator 315. The threshold comparator 315 includes an output 320 that provides the result of the comparison to the energy clamping circuit 130.

The energy clamping circuit 130 includes a switching arrangement 325 connected between the energy source 125 and the audio power amplifier 115. The switching arrangement 325 include one or more switches, for example, bi-polar junction transistors (BJT), field effect transistors (FETs), or the like. The signals from the output 320 provide gate signals to the switching arrangement 325, which in turn controls the energy clamping circuit 130 to clamp the power flow between the energy source 125 and the audio power amplifier 115.

Figure 4:
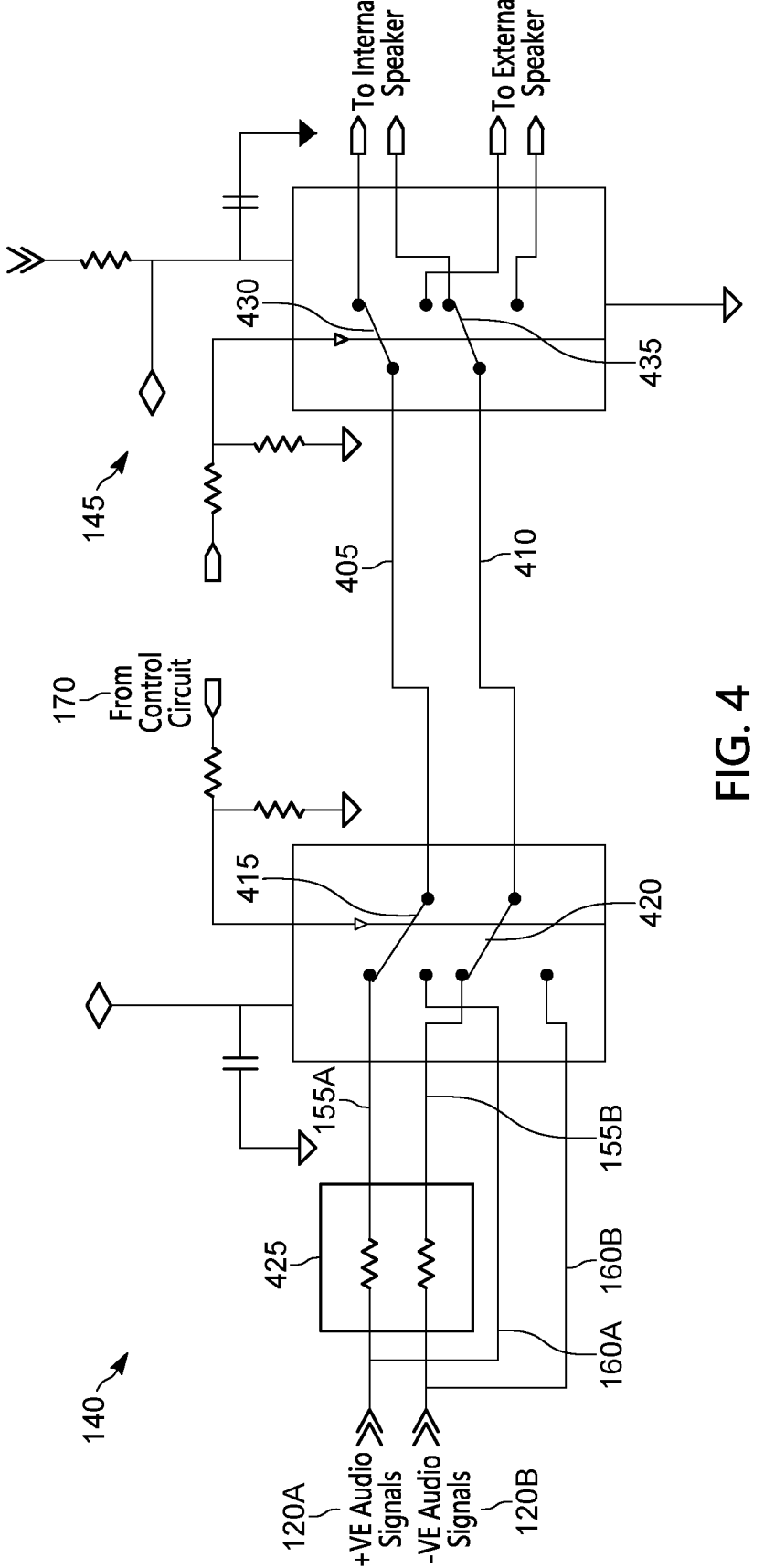
FIG. 4 is a schematic of a current path switching circuit and a peripheral component switching circuit of the portable communications device of FIG. 1 in accordance with some examples.

FIG. 4 illustrates a schematic of an example implementation a transient energy module including the current path switching circuit 140, the speaker switching circuit 145, the low resistance current path 155, and the high resistance current path 160. In the example illustrated, the audio signals 120 received from the energy sensing circuit 135 are split into the low resistance current path 155 and the high resistance current path 160 that are provided to the current path switching circuit 140 as input. In the example shown, the positive audio signals 120A are split into a positive low resistance current path 155A and a positive high resistance current path 160A and the negative audio signals 120B are split into a negative low resistance current path 155B and a negative high resistance current path 160B. A positive signal path 405 and a negative signal path 410 connect the current path switching circuit 140 to the speaker switching circuit 145. The current path switching circuit 140 includes a first current path switch 415 and a second current path switch 420 receiving the split audio signals 120. The first current path switch 415 electrically couples one of the positive low resistance current path 155A or the positive high resistance current path 160A to the positive signal path 405. The second current path switch 420 electrically couples one of the negative low resistance current path 155A or the negative high resistance current path 160A to negative signal path 410. The first current path switch 415 and the second current path switch 420 may be provided in a double pole double throw (DPDT) configuration such that that first current path switch 405 and the second current path switch 410 electrically couple only one of the low resistance current path 155 or the high resistance current path 160 to the signal paths 405, 410. The DPDT configuration may be implemented using, for example, transistor switches that receive the output of the control circuit 170 as the gate signals. In a first configuration, the first current path switch 415 and the second current path switch 420 (that is, the current path switching circuit 140) electrically couple the audio signals 120 to the speakers 105, 110 via the low resistance current path 155. In a second configuration, the first current path switch 405 and the second current path switch 410 (that is, the current path switching circuit 140) electrically couple the audio signals 120 to the speakers 105, 110 via the high resistance current path 160. The control circuit 170 provides a signal to the current path switching circuit 140 to switch between the first configuration and the second configuration. The current path switching circuit 140 may include a different switching arrangement than the one described above to selectively enable one of the low resistance current path 155 and the high resistance current path 160.

In the example illustrated, the low resistance current path 155 and the high resistance current path 160 are provided between the audio power amplifier 115 and the current path switching circuit 140. In other examples, a different configuration may be used, for example, by providing the low resistance current path 155 and the high resistance current path 160 between the current path switching circuit 140 and the speaker switching circuit 145. The low resistance current path 155 may be a normally enabled path and may not include a resistive load. The high resistance current path 160 may be enabled during low temperature conditions to avoid energy clamping to provide high quality audio through the speakers 105, 110. The high resistance current path 160 includes a resistive load 425. The arrangement shown in FIG. 4 provides an example implementation of selectively connecting a resistive load between the audio power amplifier 115 and the speakers 105, 110.

The speaker switching circuit 145 includes a first speaker switch 430 and a second speaker switch 435. The first speaker switch 430 electrically couples the positive signal path 405 to one of the internal speaker 105 or the external speaker 110 and the second speaker switch 435 electrically couples the negative signal path 410 to one of the internal speaker 105 or the external speaker 110. The first speaker switch 430 and the second speaker switch 435 may be provided in a double pole double throw (DPDT) configuration such that the first speaker switch 430 and the second speaker switch 435 electrically couple the low resistance current path 155 and the high resistance current path 160 to only one of the internal speaker 105 or the external speaker 110. The DPDT configuration may be implemented using, for example, transistor switches that receive the gate signals to be turned on an off. In a first configuration, the first speaker switch 430 and the second speaker switch 435 electrically couple the signal paths 405, 410 to the internal speaker 105. In a second configuration, the first speaker switch 430 and the second speaker switch 435 electrically couple the signal paths 405, 410 to the external speaker 110. That is, the first speaker 105 is the active speaker in the first configuration and the second speaker 110 is the active speaker in the second configuration. In one example, the signal to the speaker switching circuit 145 to switch between the first configuration and the second configuration may be provided by the electronic processor 175. In another example, the signal to the speaker switching circuit 145 to switch between the first configuration and the second configuration may be provided by the audio power amplifier 115, for example, based on a mode of the audio power amplifier 115. In another example, the second configuration may be automatically selected when a physical connection to the external speaker 110 is detected. The speaker switching circuit 145 may include a different switching arrangement than the one described above to selectively enable one of the internal speaker 105 or the external speaker 110.

Figure 5:
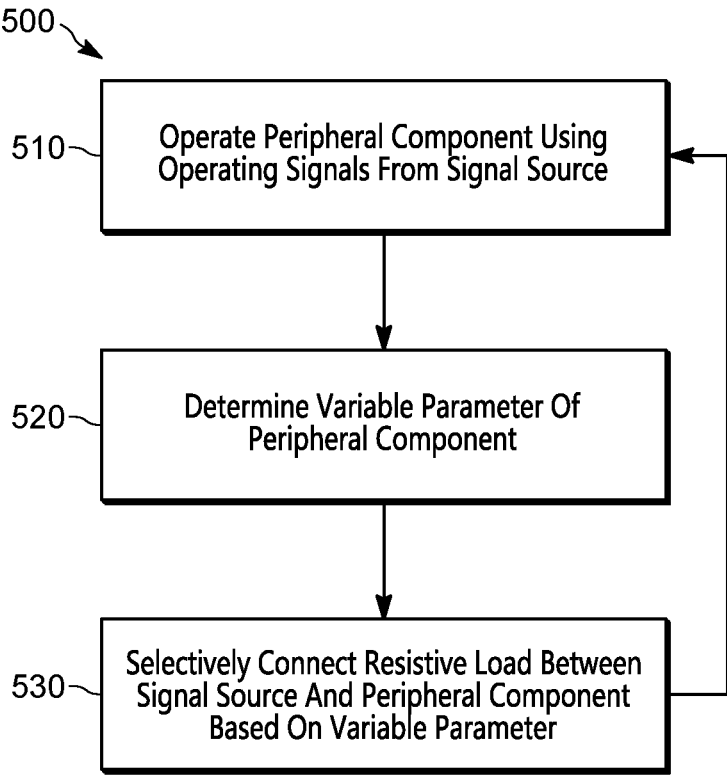
FIG. 5 is a flowchart of a method for enhancing performance of the portable communications device of FIG. 1 in accordance with some examples.

FIG. 5 is a flowchart of an example method 500 for enhancing performance of the portable communications device 100. In the example illustrated, the method 500 includes operating a peripheral component using operating signals from a signal source (at block 510). The peripheral component is, for example, the internal speaker 105, the external speaker 110, the camera, the vibration interface, the sensor, or the like. The signal source is, for example, the audio power amplifier 115 for the speakers 105, 110, a camera controller for a camera, a vibration motor controller for the vibration interface, a sensor controller for the sensor, or the like. The audio signals 120 are provided from the audio power amplifier 115 to the speakers 105, 110.

The method 500 includes determining, using the sensing circuit 165, a variable parameter of the peripheral component (at block 520). The sensing circuit 165 is configured to measure or detect a variable parameter of the peripheral component. The variable parameter includes, for example, a resistance of the active speaker 105, 110, a temperature of the active speaker 105, 110, a voltage of the energy source 125, or the like. The resistance of the active speaker 105, 110 varies with the temperature of the environment. For example, the resistance of the active speaker 105, 110 may be 30% lower at −25 Celsius (C) than at 25 C. This variance in resistance of the active speaker 105, 110 to dissipate lower energy at lower temperature thereby being able to support higher current. The sensing circuit 165 detects this change in resistance using the variable parameter. Specifically, the resistance of the active speaker 105, 110 may be detected using any one of the resistance of the active speaker 105, 110, the temperature of the active speaker 105, 110, or the voltage of the energy source 125.

The method 500 includes selectively connecting, using the control circuit 170 coupled to the sensing circuit 165, a resistive load between the signal source and the peripheral component based on the variable parameter (at block 530). The control circuit 170 may include a comparator to compare the variable parameter to a threshold. The control circuit 170 outputs a signal to the current path switching circuit 140 to enable the high resistance current path 160 when the variable parameter satisfies a threshold.

As noted above, the resistance of the speakers 105, 110 varies widely across a normal operating temperature range of a HAZLOC environment. When the temperature of the speakers 105, 110 decreases, the speakers 105, 110 can support a higher current without affecting the total energy output of the speakers 105, 110. However, the energy clamping system may clamp the energy when this higher current is detected. To avoid an early clamping of the energy to the audio power amplifier 115, the above noted techniques allow for connection of a resistive load that lowers the current being provided to the speaker thereby extending the operating time and therefore the audio quality of the portable communications device 100.

Once a load path (that is, one of the low resistance current path 155 or the high resistance current path 160) is selected, the sensing circuit 165 may monitor the current across the speakers 105, 110 in both ways, that is, entering the load and exiting the load. The control circuit 170 may further clamp the energy, for example, using the energy clamping circuit 130 or the current path switching circuit 140 to clamp the energy provided to the speakers 105, 110 when the current to or from the speakers 105, 110 exceeds an allowable threshold. In one example, the control circuit 170 may both switch to the high resistance current path 160 and perform energy suppression using the energy clamping circuit 130 when a high current entering the speakers 105, 110 is detected. The current flowing to the speakers 105, 110 is detected and provided to the sensing circuit 165 using the energy sensing circuit 135 and the energy threshold circuit 150. The allowable threshold for energy clamping used by the energy threshold circuit 150 and the control circuit 170 may be selected as the energy threshold set by the Underwriters Laboratory (UL), Atmospheres Explosibles (ATEX), International Electrotechnical Commission Explosive (IECEx), or other intrinsic safety standards. It should be noted that in intrinsic safety standards such as those noted above, any safety circuit is required to be hardware-based. Specifically, the intrinsic safety standards presume that any software or firmware based safety techniques will automatically fail. Accordingly, the above-noted safety circuits are implemented in hardware using electrical components and without involvement of the electronic processor 175.

By using the above noted techniques 4-7 deciBels (dB) improvement in loudness, about 24% improvement in digital distortion, and about 14% improvement in analog distortion may be achieved.

In the foregoing specification, specific embodiments, examples, aspects, and features have been described. However, one of ordinary skill in the art appreciates that various modifications and changes can be made without departing from the scope of the subject matter as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. Unless the context of their usage unambiguously indicates otherwise, the articles "a," "an," and "the" should not be interpreted as meaning "one" or "only one." Rather these articles should be interpreted as meaning "at least one" or "one or more." Likewise, when the terms "the" or "said" are used to refer to a noun previously introduced by the indefinite article "a" or "an," "the" and "said" mean "at least one" or "one or more" unless the usage unambiguously indicates otherwise.

Also, it should be understood that the illustrated components, unless explicitly described to the contrary, may be combined or divided into separate software, firmware, and/or hardware. For example, instead of being located within and performed by a single electronic processor, logic and processing described herein may be distributed among multiple electronic processors. Similarly, one or more memory modules and communication channels or networks may be used even if embodiments described or illustrated herein have a single such device or element. Also, regardless of how they are combined or divided, hardware and software components may be located on the same computing device or may be distributed among multiple different devices. Accordingly, in this description and in the claims, if an apparatus, method, or system is claimed, for example, as including a controller, control unit, electronic processor, computing device, logic element, module, memory module, communication channel or network, or other element configured in a certain manner, for example, to perform multiple functions, the claim or claim element should be interpreted as meaning one or more of such elements where any one of the one or more elements is configured as claimed, for example, to make any one or more of the recited multiple functions, such that the one or more elements, as a set, perform the multiple functions collectively.

It will be appreciated that some embodiments, examples, aspects, and features may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, one or more of the embodiments, examples, aspects, and features presented herein can be implemented as a computer-readable storage medium having computer readable code stored thereon for programming a computer (e.g., comprising a processor) to perform a method as described and claimed herein. Any suitable computer-usable or computer readable medium may be utilized. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. In the context of this document, a computer-usable or computer-readable medium may be any medium that can contain, store, communicate, propagate, or transport the program for use by or in connection with the instruction execution system, apparatus, or device.

Further, it is expected that one of ordinary skill, when guided by the concepts and principles disclosed herein will be readily capable of generating such software instructions and programs and ICs with minimal experimentation. For example, computer program code for carrying out operations of various example embodiments may be written in an object oriented programming language such as Java, Smalltalk, C++, Python, or the like. However, the computer program code for carrying out operations of various example embodiments may also be written in conventional procedural programming languages, such as the "C" programming language or similar programming languages. The program code may execute entirely on a computer, partly on the computer, as a stand-alone software package, partly on the computer and partly on a remote computer or server or entirely on the remote computer or server. In the latter scenario, the remote computer or server may be connected to the computer through a local area network (LAN) or a wide area network (WAN), or the connection may be made to an external computer (for example, through the Internet using an Internet Service Provider).

The terms "substantially," "essentially," "approximately," "about," or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "one of," without a more limiting modifier such as "only one of," and when applied herein to two or more subsequently defined options such as "one of A and B" should be construed to mean an existence of any one of the options in the list alone (e.g., A alone or B alone) or any combination of two or more of the options in the list (e.g., A and B together).

A device or structure that is "configured" in a certain way is configured in at least that way, but may also be configured in ways that are not listed.

The terms "coupled," "coupling," or "connected" as used herein can have several different meanings depending on the context in which these terms are used. For example, the terms coupled, coupling, or connected can have a mechanical or electrical connotation. For example, as used herein, the terms coupled, coupling, or connected can indicate that two elements or devices are directly connected to one another or connected to one another through intermediate elements or devices via an electrical element, electrical signal or a mechanical element depending on the particular context.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples and embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A portable communications device comprising:
a peripheral component;
a signal source configured to provide operating signals to the peripheral component;
a sensing circuit configured to sense a variable parameter of the peripheral component; and
a control circuit coupled to an output of the sensing circuit and configured to selectively connect a resistive load between the signal source and the peripheral component based on an indication of the variable parameter received from the output.

2. The portable communications device of claim 1, further comprising:
a first current path connecting the signal source to the peripheral component; and
a second current path connecting the signal source to the peripheral component, the second current path having a higher resistance than the first current path.

3. The portable communications device of claim 2, further comprising:
a switching circuit configured to selectively enable the first current path and the second current path, wherein the control circuit is further configured to enable the second current path using the switching circuit to selectively connect the resistive load.

4. The portable communications device of claim 1, wherein the peripheral component is a speaker and the signal source is a power amplifier.

5. The portable communications device of claim 1, wherein the peripheral component is a first peripheral component, further comprising:
a second peripheral component configured to receive the operating signals from the signal source; and
a switching circuit configured to selectively connect one selected from a group consisting of the first peripheral component and the second peripheral component to the signal source.

6. The portable communications device of claim 1, further comprising:
a energy source configured to provide operating power to the signal source; and
an energy limiting circuit coupled between the energy source and the signal source and configured to limit current flow between the energy source and the signal source based on an energy output of the signal source.

7. The portable communications device of claim 1, wherein the control circuit is configured to connect the resistive load between the signal source and the peripheral component in response to the variable parameter satisfying a threshold.

8. A method for enhancing performance of a portable communications device, the method comprising:
operating a peripheral component using operating signals from a signal source;
determining, using a sensing circuit, a variable parameter of the peripheral component; and
selectively connecting, using a control circuit coupled to the sensing circuit, a resistive load between the signal source and the peripheral component based on the variable parameter.

9. The method of claim 8, further comprising:
providing a first current path connecting the signal source to the peripheral component; and
a second current path connecting the signal source to the peripheral component, the second current path having a higher resistance than the first current path.

10. The method of claim 9, further comprising:
enabling, using a switching circuit, the second current path to selectively connect the resistive load.

11. The method of claim 8, wherein the peripheral component is a speaker and the signal source is a power amplifier.

12. The method of claim 8 wherein the peripheral component is a first peripheral component, further comprising:
operating a second peripheral component using the operating signals from the signal source; and
selectively connecting, using a switching circuit, one selected from a group consisting of the first peripheral component and the second peripheral component to the signal source.

13. The method of claim 8, further comprising:
providing, using a energy source, operating power to the signal source; and
limiting, using an energy limiting circuit coupled between the energy source and the signal source, current flow between the energy source and signal source based on an energy output of the signal source.

14. The method of claim 8, wherein selectively connecting the resistive load between the signal source and the peripheral component is performed in response to the variable parameter satisfying a threshold.

15. A portable communications device comprising:

a speaker;

a power amplifier configured to provide audio signals to the speaker;

a sensing circuit configured to sense a variable parameter of the speaker; and a control circuit coupled to an output of the sensing circuit and configured to selectively connect a resistive load between the power amplifier and the speaker based on an indication of the variable parameter received from the output.

16. The portable communications device of claim 15, further comprising:

a first current path connecting the power amplifier to the speaker; and a second current path connecting the power amplifier to the speaker, the second current path having a higher resistance than the first current path.

17. The portable communications device of claim 16, further comprising:

a switching circuit configured to selectively enable the first current path and the second current path, wherein the control circuit is further configured to enable the second current path using the switching circuit to selectively connect the resistive load.

18. The portable communications device of claim 15, wherein the speaker is a first speaker, further comprising:

a second speaker configured to receive the audio signals from the power amplifier; and a switching circuit configured to selectively connect one selected from a group consisting of the first speaker and the second speaker to the power amplifier.

19. The portable communications device of claim 15, further comprising:

a energy source configured to provide operating power to the power amplifier; and an energy limiting circuit coupled between the energy source and the power amplifier and configured to limit current flow between the energy source and the power amplifier based on an energy output of the power amplifier.

20. The portable communications device of claim 15, wherein the control circuit is configured to connect the resistive load between the power amplifier and the speaker in response to the variable parameter satisfying a threshold.

* * * * *